(12) United States Patent
Vaz

(10) Patent No.: US 6,479,743 B2
(45) Date of Patent: Nov. 12, 2002

(54) PHOTON POWER CELL

(76) Inventor: Guy Andrew Vaz, 20 Pasir Ris Heights, Singapore (SG), 519227

( * ) Notice: Subject to any disclaimer, the term of this patent is extended or adjusted under 35 U.S.C. 154(b) by 0 days.

(21) Appl. No.: 09/813,457

(22) Filed: Mar. 21, 2001

(65) Prior Publication Data

US 2002/0121299 A1 Sep. 5, 2002

(30) Foreign Application Priority Data

Dec. 28, 2000 (SG) ........................................ 200007680-2

(51) Int. Cl.[7] ........................ H01L 31/115; H01L 31/06; H02N 6/00
(52) U.S. Cl. ........................ 136/253; 136/256; 136/261; 136/244; 136/246; 136/248; 136/206; 310/303
(58) Field of Search ................................ 136/253, 256, 136/261, 244, 246, 248, 206; 310/303

(56) References Cited

U.S. PATENT DOCUMENTS

| | | | | |
|---|---|---|---|---|
| 3,031,519 A | * | 4/1962 | Silverman | 136/253 |
| 3,253,951 A | * | 5/1966 | Marinaccio et al. | 438/537 |
| 3,261,074 A | * | 7/1966 | Beauzee | 438/8 |
| 3,903,417 A | * | 9/1975 | Peter | 250/369 |
| 3,942,901 A | * | 3/1976 | Ekstrand | 356/251 |
| 4,741,120 A | * | 5/1988 | Cota et al. | 43/17.6 |
| 5,082,505 A | * | 1/1992 | Cota et al. | 136/253 |
| 5,519,591 A | * | 5/1996 | McCrary | 362/571 |
| 5,675,927 A | * | 10/1997 | Kloos | 43/17.5 |

* cited by examiner

*Primary Examiner*—Alan Diamond
(74) *Attorney, Agent, or Firm*—Ladas & Parry

(57) ABSTRACT

A photon power cell has at least one photo-electric cell (10), one or more layers of filter glass (15) and a radioactive-energised fluorescent material (20) which produces photons that are converted into electrical energy by the photo-electric cell (10). The photo-electric cell (10) may be a standard solar cell silicon wafer (14) with coatings (12) of phosphorus applied to the surface of the wafer (10). The layer of filter glass (15) contains lead, gold and/or graphite to protect the PN junction of the solar cell (10) from unwanted radioactive particles from the radioactive-energised fluorescent material (20), while being transparent to photons within a required frequency spectrum to produce a photo-electric effect. A plurality of solar cells (10) may be arranged in a stack interposed between layers or coatings of the radioactive-energised fluorescent material (20) to provide power cells which can power electric devices such as from mobile telephones to electric vehicles for several years.

21 Claims, 1 Drawing Sheet

PHOTON POWER CELL

FIELD OF THE INVENTION

This invention relates to electrical power generation and is particularly concerned with providing a photon power cell for converting the energy of photons of light into electrical energy.

BACKGROUND OF THE INVENTION

Various types of electrical power sources are known, ranging from small batteries to large power stations, and including solar cells which use the photo-electric effect to convert the energy of photons of light, typically sunlight, to electrical energy. There is, however, a requirement for portable electrical power generation for a multitude of applications from consumer electronics, such as CD players, radios, mobile telephone and portable computers, to higher power consumption applications, such as electric carts and cars.

SUMMARY OF THE INVENTION

According to one aspect of the invention there is provided a photon power cell comprising:

at least one photo-electric cell, and a radioactive-energised fluorescent material wherein photons from the radioactive-energised fluorescent material are converted into electrical energy by the photo-electric cell.

Preferably, the photo-electric cell comprises a plurality of solar cells and the radioactive-energised fluorescent material is applied to each of the solar cells.

Each solar cell wafer may conveniently comprise an industry standard silicon wafer of P-type material with diffused coatings of N-type material, such as phosphorus, applied to both major surfaces of the wafer.

However, other types of solar cells may be utilised in the present invention, for example a solar cell having a wafer of N-type material between layers of P-type material.

The photo-electric cell preferably includes one or more layers of a filter material which is substantially transparent to photons within a required frequency spectrum to produce the photo-electric effect, but which absorbs unwanted radioactive particles from the radioactive energised fluorescent material.

The layers of filter material are preferably provided between the or each solar cell wafer and the radioactive-energised fluorescent material.

In one preferred embodiment, the or each filter layer comprises glass to which radioactive particle absorbing material is added.

The radioactive energised fluorescent material may be applied to the filter layers either as a continuous coating or as a discontinuous coating, such as in substantially parallel lines or as a sputter sprayed coating.

The radioactive energised fluorescent material is preferably a chemical-radioactive fluorescent. Examples of suitable chemical-radioactive fluorescents suitable for use in the present invention include uranium-fluoride based fluorescents and tritium-phosphorus fluorescents. It will, however, be appreciated that various other chemical-radioactive fluorescent materials may be used in the present invention, including "light fluorescents" in fluid form which are suitable for use in larger power applications.

BRIEF DESCRIPTION OF THE DRAWINGS

A preferred embodiment of the present invention will now be described, by way of example only, with reference to the accompanying drawings, in which.

DETAILED DESCRIPTION OF THE DRAWINGS

Figure 1:
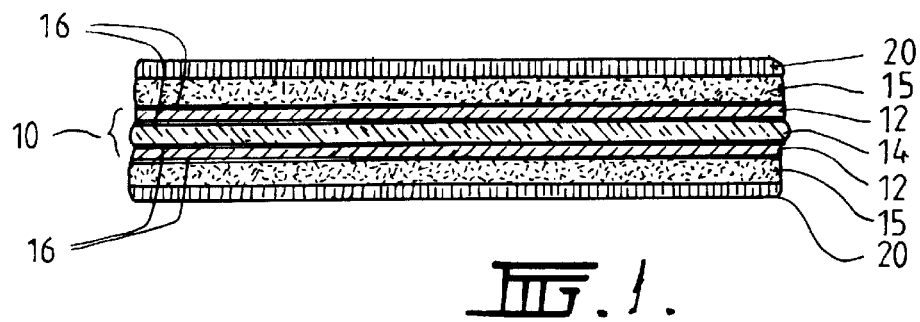
FIG. 1 is an enlarged cross-section through a photon power cell in accordance with the invention.

The photon power cell shown in FIG. 1 comprises a solar cell wafer 10 with filter layers 15 applied to both major surfaces of the solar cell wafer 10, and coatings 20 of chemical-radioactive material applied to the filter layers 16.

The solar cell wafer 10 may conveniently be formed from an industry standard solar cell comprising: coatings 12 of N-type material, applied to both major surfaces of a silicon wafer 14 of P-type material.

The silicon wafer 14 is typically about 200 mm in diameter and about 300 microns ($\mu$m) thick with the N-type material preferably comprising diffused coatings 12 of phosphorus. The boundary between each phosphorus coating 12 and the silicon wafer 14 constitutes an P-N junction across which an electric potential is developed when photons within a particular range of wavelengths impinge upon the solar cell wafer. The thickness of silicon wafer is preferably such as to create a photo-electric effect for photons within the blue-green spectrum of light. A conducting grid 16 is applied to both sides of each phosphorus coating 12. Silver is the preferred material for the conducting grids because of its high electrical conductivity and easy diffusion to the phosphorus (N-type) material. The thickness of each conducting grid 16 is preferably about 50–75 microns ($\mu$m) high. The lines of the silver conducting grids 16 are preferably about 150–200 microns ($\mu$m) wide and are placed about 2 mm apart.

Both sides of the silicon wafer 10 are passivated with filter layers 15. The coatings 20 of chemical-radioactive fluorescent material are then applied to the outer surfaces of the filter layers 15.

The fluorescent material coating 20 has two parts: a chemical-radioactive component and a fluorescing component. The chemical-radioactive component causes the fluorescing component to flow brightly thereby providing the light source for the photon power cell. The light source in turn provides the solar wafer 10 with photons which are converted into electrical energy at the P-N junction. Generally, a brighter light source will produce more photons and therefore more powder is generated by the photon power cell.

One chemical-radioactive fluorescent which has been used in a prototype power cell in accordance with the invention is tritium-phosphorus. However, other types of chemical-radioactive fluorescents can be used in the present invention, such as uranium-fluoride based fluorescents which can provide brighter light in a broad spectrum for several years. Tritium-phosphorus has a much shorter half-life of about 15 years. It is estimated that a tritium based photon power cell can effectively last for 7–10 years.

The filter layers 15 are provided to protect the P-N junctions of the solar cell wafers 10 from unwanted radioactive particles while producing the desired frequency spectrum to obtain photon accumulation. The filter layers 15 preferably comprise glass with a radioactive-absorbing material such as gold and/or lead and/or graphite power added to the glass.

In the tritium phototype, leaded glass with about 0.05% lead is used, though it is envisaged that higher energy radioactive materials, such as radium, uranium or plutonium energised fluorescents will require higher levels of gold, lead or graphite to be added to the glass and may also require thicker glass deposition.

Figure 3:
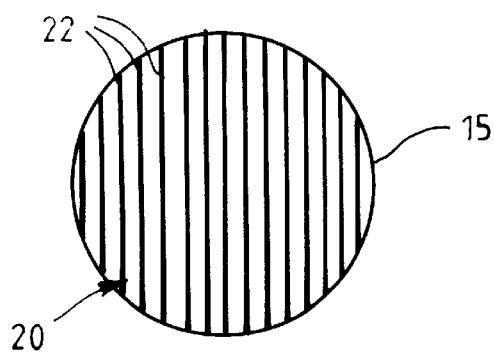
FIG. 3 is a front or rear view of a photon power cell showing the radioactive fluorescent material applied in parallel lines.
Figure 4:
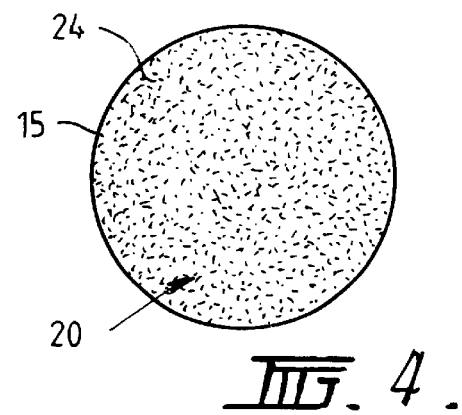
FIG. 4 is a front or rear view of a photon power cell showing the radioactive fluorescent material applied as a sputter spray coating.

The fluorescent material 20 may be applied to the glass filter layers 15 in a number of different ways. FIG. 3 shows the fluorescent material 20 applied in parallel lines 22, whereas FIG. 4 shows the fluorescent material 20 applied to the glass filter layer 15 as a sputter spray 24. In a prototype, concentrated fluorescent tritium was sputter sprayed onto the glass to a thickness of about 200 microns ($\mu$m) to cover approximately 30% of the total surface of the glass filter layer 15. Whilst it is possible for the fluorescent coating 20 to cover the glass filter surface completely, this is generally not preferred for two reasons. First, the gaps allow more light to pass through and be bounced around between two wafers in a multi-layer photon power cell (see FIG. 2). Secondly, less heat is produced, thus reducing or eliminating a need for a cooling system.

Figure 2:
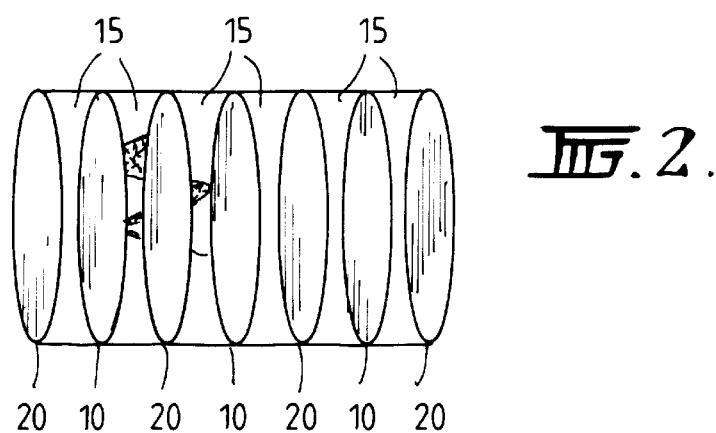
FIG. 2 is a schematic representation of a photon power cell comprising radioactive fluorescent material interposed between a plurality of solar cell wafers.

Referring to FIG. 2, there is shown schematically a photon power cell comprising a stack of solar cell wafers 10 disposed between a plurality of layers of chemical-radioactive fluorescent material 20. Each solar cell wafer 10 is preferably of the same construction as described with reference to FIG. 1, having a silicon wafer of the P-type material sandwiched between coatings of N-type material with conducting grids on each side of the P-N junction. Glass filter layers 15 are provided between the layers of chemical-radioactive fluorescent material 20 and the solar cell wafers 10, and it will be appreciated that in the stack of FIG. 2 the chemical-radioactive fluorescent material 20 may be applied as coatings to the interposed glass filter layers 15 as described with reference to FIG. 1 and FIG. 3 or FIG. 4. Likewise, the same or similar materials may be used for the solar cell wafers 10, the filter layers 15 and the chemical-radioactive fluorescent layers 20 as described with reference to FIG. 1.

In a prototype power cell, a stack of eleven silicon solar cell wafers were packaged into a cell housing made of 0.2 mm stainless steel, with a cover separated from the base with silicone rubber.

As illustrated schematically in FIG. 2, photons emanating from the fluorescent material 20 between solar cell wafers 10 may bounce back and forth between the wafers 10 on each side. This enhances the capture and conversion of photons into electrical energy.

In the photon power cell of FIG. 2, electric terminals connected to the conducting grids on each solar cell wafer 10 of the stack can be arranged in series to produce more power than the single solar cell wafer 10 of FIG. 1.

It is envisaged that a photon power cell containing a stack of eleven solar cell wafers 10 having 22 sides treated as described above with filter layers 15 and chemical-radioactive fluorescent materials 20 could produce about 220 watts of electrical power. 120 cells coupled in series could produce about 26 kilowatts. However, this many cells coupled together is likely to require a cooling system, possibly in the form of an inner and outer jacket to contain a liquid or air coolant.

It will be appreciated that a photon power cell in accordance with the present invention has many different applications as exemplified by the following list of applications when continuous or sputter-sprayed coatings or light fluorescent coatings are used:

| | | |
|---|---|---|
| a | Very small cells for mobile hand phones | 3–5 wafers, continuous coating. |
| b | Note book computers | 10 wafers, sputter sprayed coating. |
| c | Very light electric car (air cooled) | 1,500 wafers, sputter spray coating. |
| d | Electric car (water cooled) | 1,500 wafers, continuous coating |
| e | Heavy electric vehicle (water cooled) | 3,000 wafers, continuous or light fluorescent. |
| f | Power substation | 10,000+ wafers, light fluorescent. |

For very large kilowatt or megawatt power application, such as for homes or power stations, it is envisaged that "light fluorescents" would be used.

Light fluorescents can be provided in liquid or gaseous form and pumped into the power cell when electrical energy is needed and pumped out of the cell when energy is not required. The light fluorescents could be contained separately in a modular system.

Figure 5:
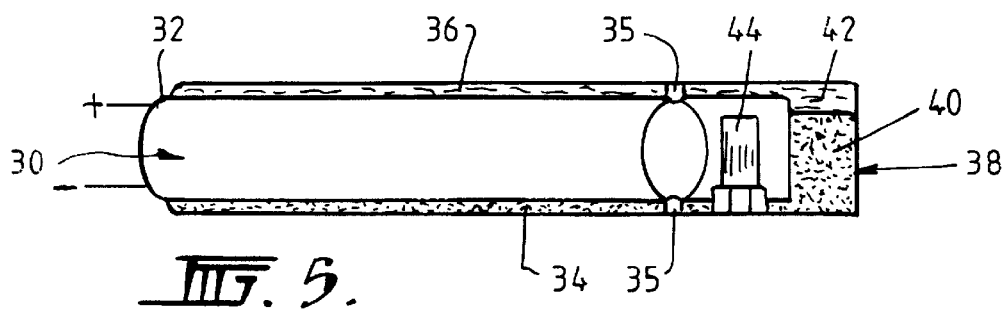
FIG. 5 is a schematic view of a photon power cell comprising a solar cell stack using a light fluorescent.

An example of a photon power cell which uses a light fluorescent is illustrated schematically in FIG. 5. The photon power cell of FIG. 5 comprises a stack 30 of solar cell wafers contained in a casing 32 having positive (+) and negative (−) terminals. A channel 34 for a liquid light fluorescent is provided at the bottom of the stack 30 and a channel 36 for an inert gas, such as helium, is provided at the top of the stack 30. The bottom and top channels 34, 36 are connected by valves 35, 37 to a reservoir 38 for the liquid light fluorescent 40 and for inert gas 42. A two-way metering pump 44 is provided for pumping light fluorescent 40 to and from the bottom channel 34. When the power cell is not being used as a source of electrical power, light fluorescent 40 is pumped from the bottom channel 34 to the reservoir 38. When the power cell is required for use, the liquid light fluorescent 40 is pumped from the reservoir 38 to the bottom channel 34. The solar wafer stack 30 may have further channels for light fluorescent between the solar cell wafers and into which the light fluorescent is pumped when the cell is required for use.

The light fluorescent photon power cell of FIG. 5 may take a few minutes from the start of pumping to produce peak power. During this time, an industry standard battery or capacitor may be used in conjunction with the photon power cell as standby power. In order to satisfy larger power requirements, it will be appreciated that a plurality of photon power cells of the type shown in FIG. 5 may be provided in series.

Photon power cells in accordance with the invention can provide continuous electrical power for several years in small portable packages. For example, a photon power cartridge measuring 25 mm by 50 mm by 10 mm thick could power a mobile hand phone for about seven years, while a 100 mm by 100 mm by 1.2 thick cartridge could power a notebook computer for about seven years. A larger photon power package measuring 1.2 m long×200 mm by 200 mm could supply an electric vehicle with about 32 kw for about 10 years continuously.

It will be appreciated that various modifications may be made to the embodiments of the present invention as described above without departing from the scope and spirit of the present invention as defined in the claims. For example, it may be possible to use gallium arsenide solar cells instead of silicon based solar cells. Also, radioactive waste material may be used since harmful particles are depleted.

What is claimed is:

1. A photon power cell comprising at least one photo electrical cell and a radioactive-energised fluorescent material, wherein photons from the radioactive-energised material are converted into electrical energy by the photo-electric cell, wherein the photo-electric cell includes at least one layer of filter material which is substantially transparent to photons within a required frequency spectrum to produce a photo-electric effect, but which absorbs radioactive particles from the radioactive-energised fluorescent material.

2. A photon power cell according to claim 1 wherein the photon power cell comprises a plurality of solar cells with the radioactive-energised fluorescent material applied to each of the solar cells.

3. A photon power cell according to claim 2 wherein each solar cell comprises a wafer of P-type or N-type material, and layers or coatings of N-type or P-type material respectively applied to surfaces of the wafer.

4. A photon power cell according to claim 2 wherein each solar cell comprises a wafer of silicon P-type material with diffused coatings of phosphorus applied to both sides of the wafer.

5. A photon power cell according to claim 2 wherein the plurality of solar cells are arranged in a stack.

6. A photon power cell according to claim 1 wherein the at least one layer of filter material is provided between the photo-electric cell and the radioactive-energised fluorescent material.

7. A photon power cell according to claim 1 wherein the at least one layer of filter material comprises glass to which a radioactive particle-absorbing material is added.

8. A photon power cell according to claim 7 wherein the radioactive particle-absorbing material comprises at least one of the following: lead, gold and graphite powder.

9. A photon power cell according to claim 1 wherein the radioactive-energised fluorescent material is applied as a coating to the at least one layer of filter material.

10. A photon power cell according to claim 9 wherein the radioactive-energised fluorescent material is a continuous coating applied to the at least one layer of filter material.

11. A photon power cell according to claim 9 wherein the radioactive-energised fluorescent material is a discontinuous coating.

12. A photon power cell according to claim 11 wherein the radioactive-energised fluorescent material is applied to the at least one layer of filter material is substantially parallel in lines.

13. A photon power cell according to claim 11 wherein the radioactive-energised fluorescent material is applied as a sputter coating to the at least one layer of the filter material.

14. A photon power cell according to claim 11 wherein the radioactive-energised fluorescent material covers approximately 30% of the at least one layer of filter material.

15. A photon power cell according to claim 1 wherein the radioactive-energised fluorescent material comprises a chemical-radioactive fluorescent material.

16. A photon power cell according to claim 15 wherein the chemical-radioactive fluorescent material is tritium-phosphorus based.

17. A photon power cell according to claim 15 wherein the chemical-radioactive fluorescent material is uranium-fluoride based.

18. A photon power cell according to claim 1 wherein the radioactive-energised fluorescent material comprises a light fluorescent in fluid form.

19. A photon power cell according to claim 18 wherein the light fluorescent fluid is pumped into the power cell when power is required and pumped out of the power cell when the cell is not in use.

20. A photon power cell comprising at least one photo-electric cell and a radioactive-energised fluorescent material, wherein photons from the radioactive-energised fluorescent material are converted into electrical energy by the photon-electric cell, and the radioactive fluorescent material comprises a chemical-radioactive fluorescent material which is uranium-fluoride based.

21. A photon power cell comprising at least one photo-electric cell and a radioactive-energised fluorescent material, wherein photons from the radioactive-energised fluorescent material are converted into electrical energy by the photo-electric cell, and wherein the radioactive-energised fluorescent material comprises a light fluorescent in fluid form which is pumped into the power cell when power is required and pumped out of the power cell when the cell is not in use.

* * * * *